(12) United States Patent
Kum et al.

(10) Patent No.: US 7,479,735 B2
(45) Date of Patent: Jan. 20, 2009

(54) ELECTRO-LUMINESCENCE DISPLAY DEVICE HAVING STRENGTH-REINFORCED PACKAGING PLATE

(75) Inventors: Do Young Kum, Daegu (KR); Sung Ho Mo, Chungcheongbuk-do (KR); Jeung Hwan Lee, Daegu (KR)

(73) Assignee: LG Display Co., Ltd., Seoul (KR)

( * ) Notice: Subject to any disclaimer, the term of this patent is extended or adjusted under 35 U.S.C. 154(b) by 20 days.

(21) Appl. No.: 11/045,381

(22) Filed: Jan. 31, 2005

(65) Prior Publication Data
US 2005/0168143 A1   Aug. 4, 2005

(30) Foreign Application Priority Data
Feb. 4, 2004   (KR) .................... 10-2004-0007246

(51) Int. Cl.
*H01J 1/62* (2006.01)
(52) U.S. Cl. ...................... 313/512; 313/504
(58) Field of Classification Search ........... 313/512
See application file for complete search history.

(56) References Cited
U.S. PATENT DOCUMENTS

| | | | | |
|---|---|---|---|---|
| 3,403,834 A * | 10/1968 | Donovan | ............... | 229/406 |
| 5,685,452 A * | 11/1997 | Kristoffersson | .............. | 220/608 |
| 6,589,675 B2 * | 7/2003 | Peng | .................... | 428/690 |
| 6,611,098 B2 * | 8/2003 | Mori et al. | .................. | 313/512 |
| 6,825,612 B2 * | 11/2004 | Lai | ............................ | 313/512 |
| 6,855,961 B2 * | 2/2005 | Maruyama et al. | ............ | 257/99 |
| 2001/0013756 A1 * | 8/2001 | Mori et al. | .................. | 313/512 |
| 2002/0155320 A1 * | 10/2002 | Park et al. | ................... | 428/690 |
| 2002/0187575 A1 * | 12/2002 | Maruyama et al. | ............ | 438/33 |
| 2003/0062830 A1 * | 4/2003 | Guenther et al. | ............ | 313/512 |
| 2003/0122476 A1 * | 7/2003 | Wang et al. | ................ | 313/493 |
| 2004/0191566 A1 * | 9/2004 | Kikuchi et al. | .............. | 428/690 |

* cited by examiner

*Primary Examiner*—Peter Macchiarolo
(74) *Attorney, Agent, or Firm*—Birch, Stewart, Kolasch & Birch, LLP

(57) ABSTRACT

An electro-luminescence display device for reinforcing its strength is disclosed. In the device, an organic compound layer is provided on a substrate. A packaging plate covers the organic compound layer. Strength reinforcing members are provided at the packaging plate to reinforce strength of the packaging plate.

15 Claims, 8 Drawing Sheets

ELECTRO-LUMINESCENCE DISPLAY DEVICE HAVING STRENGTH-REINFORCED PACKAGING PLATE

This application claims the benefit of Korean Patent Application No. P2004-07246 filed in Korea on Feb. 4, 2004, which is hereby incorporated by reference.

BACKGROUND OF THE INVENTION

1. Field of the Invention

This invention relates to an electro-luminescence display (ELD), and more particularly to an electro-luminescence display device that is adaptive for reinforcing its strength.

2. Description of the Related Art

Recently, there have been developed various flat panel display devices reduced in weight and bulk that is capable of eliminating disadvantages of a cathode ray tube (CRT). Such flat panel display devices include a liquid crystal display (LCD), a field emission display (FED), a plasma display panel (PDP) and an electro-luminescence (EL) display, etc. There have been actively processed studies for attempting to make a high display quality and a large-dimension screen of the flat panel display device.

In such flat panel display devices, the PDP has drawbacks in that it has been highlighted as the most advantageous display device to make a light weight, a small size and a large dimension screen because its structure and manufacturing process are simple, but it has low light-emission efficiency and large power consumption. On the other hand, the active matrix LCD employing a thin film transistor (TFT) as a switching device has a difficulty in making a large dimension screen because it is fabricated by a semiconductor process, but has an expanded demand as it is mainly used for a display device of a notebook personal computer. However, the LCD has a drawback in that it has a difficulty in making a large dimension screen and it has large power consumption due to a backlight unit. Also, the LCD has characteristics of a large light loss and a narrow viewing angle due to optical devices such as a polarizing filter, a prism sheet, a diffuser and the like.

On the other hand, the EL display device is largely classified into an inorganic EL device and an organic EL device depending upon a material of a light-emitting layer, and is a self-luminous device. When compared with the above-mentioned display devices, the EL display device has advantages of a fast response speed, large light-emission efficiency, a large brightness and a large viewing angle.

Referring to FIG. 1, an organic EL device 1 of the EL display devices has an anode electrode 4 formed from a transparent electrode pattern on a substrate 2, and a light-emitting organic compound layer 18 formed thereon.

The anode electrode 4 is formed from any one of indium-tin-oxide (ITO), indium-zinc-oxide (IZO) and indium-tin-zinc-oxide (ITZO), etc. on the substrate 2 by a photolithography. Such an anode electrode 4 is used as a data electrode.

The organic compound layer 18 has a hole injection layer 6 and a hole carrier layer 8 sequentially formed on the anode electrode 4. A light-emitting layer 10 having a light emission function is provided on the hole carrier layer 8. Further, an electron carrier layer 12 and an electron injection layer 14 are sequentially formed on the light-emitting layer 10.

A cathode electrode 16 formed from aluminum (Al) having a high reflectivity is provided on the organic compound layer 18.

In the organic EL device, a driving voltage and current are applied to the anode electrode 4 and the cathode electrode 16, and then holes within the hole injection layer 6 and electrons within the electron injection layer 14 are progressed into the light-emitting layer 10 to thereby excite a phosphorous material within the light-emitting layer 10. A picture or an image is displayed by a principle in which a visible light generated from the light-emitting layer 10 in this manner is emitted out through the transparent anode electrode 4.

A life of the light-emitting layer 10 of the organic EL device is critically influenced by damages of the cathode electrode 16 and the organic compound layer 18 caused by moisture and oxygen in the atmosphere. In order to solve this problem, an encapsulation process utilizing a packaging plate formed from a material such as metal or glass, etc. is added.

Referring to FIG. 2, the conventional packaging plate 30 is formed from glass, plastic or canister, etc. The packaging plate 30 includes a first face 32 provided with a getter 27 for absorbing moisture and oxygen, a second face 34 having a sealant 22 coated at the edge thereof, and a connection face 36 for connecting the first and second faces 32 and 34 such that the first and second faces 32 and 34 have a desired height of step coverage.

The first face 32 is provided with the getter 27 made from barium oxide (BaO) or calcium oxide (CaO) so as to absorb moisture and oxygen. Herein, in order to prevent the getter 27 as a moisture absorbent from being dropped on the organic compound layer 18, a semi-transmitting film (not shown) is attached onto the first face 32 such that moisture and oxygen, etc. come in and out. The semi-transmitting film is formed from Teflon, polyester or paper, etc.

The second face 34 is joined with the sealant 22 coated onto the edge of the substrate 2, thereby attaching the package plate 30 onto the substrate 2. The second surface 34 of the packaging plate 30 is joined with the substrate 2 by the sealant 22 to make a vacuum state, thereby preventing a life of the EL device from being critically influenced by damage of the cathode electrode 16 and the organic compound layer 18 caused by moisture and oxygen in the atmosphere. Herein, the sealant 22 is made from an ultraviolet-curing epoxy, etc. This ultraviolet-curing epoxy allows the substrate 2 or the packaging plate 30 to be pressurized and joined by a technique such as a dispensing and a printing, etc. and then is cured by an irradiation of an ultraviolet ray. Subsequently, after a sealing was made by the sealant 22, the organic EL device is filled with an inactive gas with no moisture or oxygen. To this end, a glove box or a vacuum chamber is used.

The connection face 36 allows the first face 32 provided with the getter 27 and the second face 34 attached onto the substrate 2 to have a desired height of step coverage, thereby causing an internal space of the package plate 30 to be made into a vacuum state. In this case, the connection face 36 may vertically connect the first face 32 with the second face 34, or may connect the first face 32 with the second face 34 in such a manner to have a desired slope.

However, such a packaging plate 30 has a problem in that it has a low strength because the first face 32 provided with the getter 27 takes a flat structure. Particularly, there is raised a problem in that, when a size of the packaging plate 30 is enlarged, it has a low strength because the first face 32 takes a flat structure, thereby causing a twist of the packaging plate 30.

SUMMARY OF THE INVENTION

Accordingly, it is an object of the present invention to provide an electro-luminescence display device that is adaptive for reinforcing its strength.

In order to achieve these and other objects of the invention, an electro-luminescence display device according to an embodiment of the present invention includes an organic compound layer provided on a substrate; a packaging plate for covering the organic compound layer; and strength reinforcing means provided at the packaging plate to reinforce strength of the packaging plate.

In the electro-luminescence display device, the packaging plate includes a first face provided with a getter; a second face attached onto the substrate; and a connection face connected between the first face and the second face.

In the electro-luminescence display device, the strength reinforcing means is formed in a long valley shape at the first face.

Herein, the strength reinforcing means is provided between the end of the getter and the end of the face.

The strength reinforcing means is formed in one axis direction of the packaging plate.

Herein, said one axis direction is a minor axis direction of the packaging plate.

Alternatively, said one axis direction is a longitudinal axis direction of the packaging plate.

Otherwise, the strength reinforcing means is formed-in two axes directions crossing each other.

In the electro-luminescence display device, the packaging plate is made from a metal.

BRIEF DESCRIPTION OF THE DRAWINGS

These and other objects of the invention will be apparent from the following detailed description of the embodiments of the present invention with reference to the accompanying drawings, in which.

DETAILED DESCRIPTION OF THE PREFERRED EMBODIMENT

Reference will now be made in detail to the preferred embodiments of the present invention, examples of which are illustrated in the accompanying drawings.

Hereinafter, the preferred embodiments of the present invention will be described in detail with reference to FIGS. 3 to 8.

Figure 1:
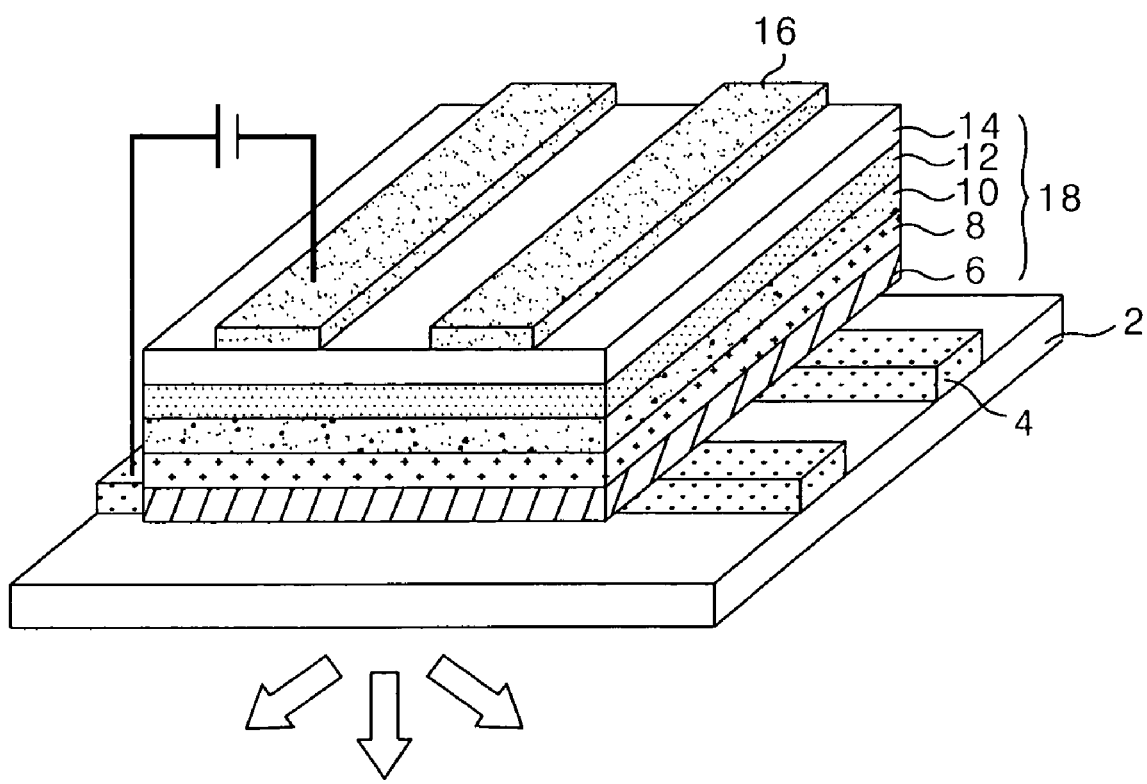
FIG. 1 is a perspective view showing a structure of a conventional electro-luminescence display device.
Figure 2:
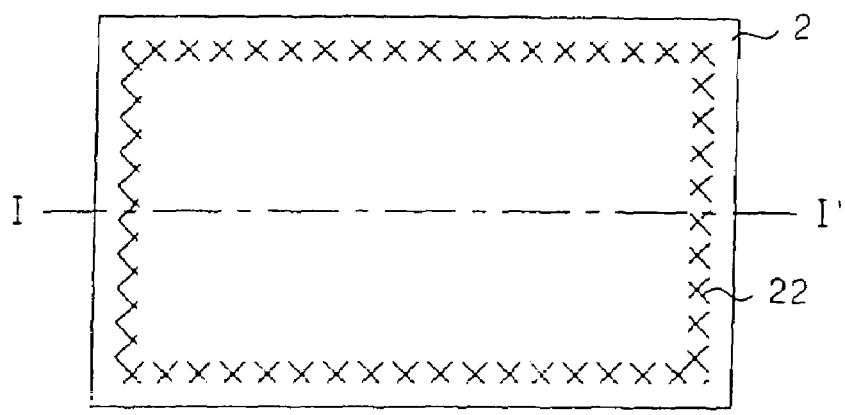
FIG. 2 is a section view of the conventional packaged electro-luminescence display device
Figure 2:
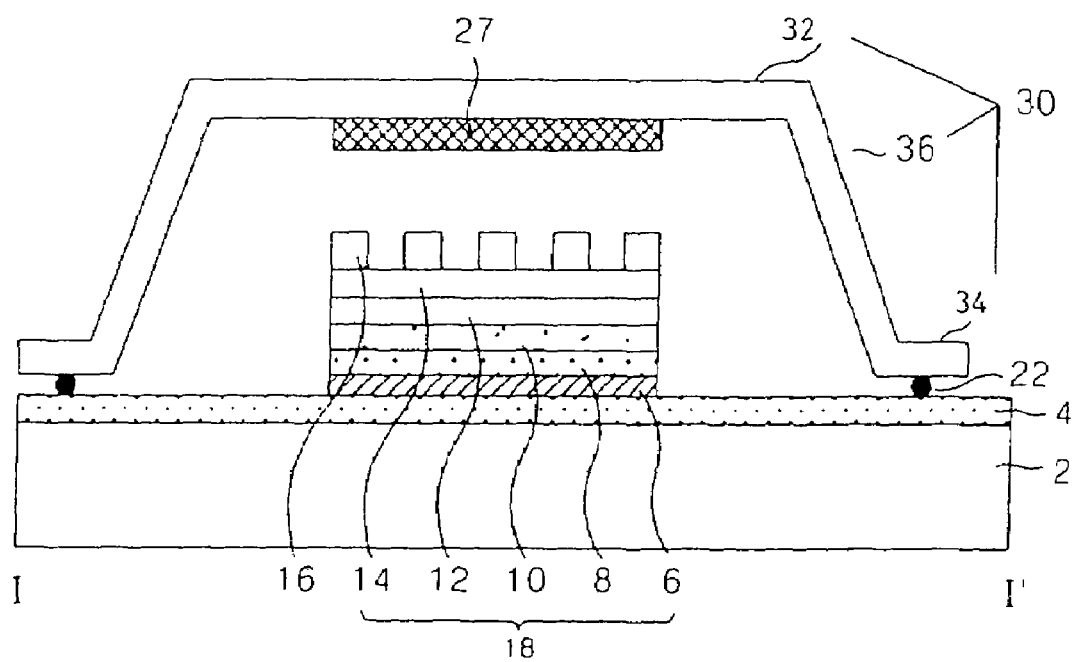
Figure 3:
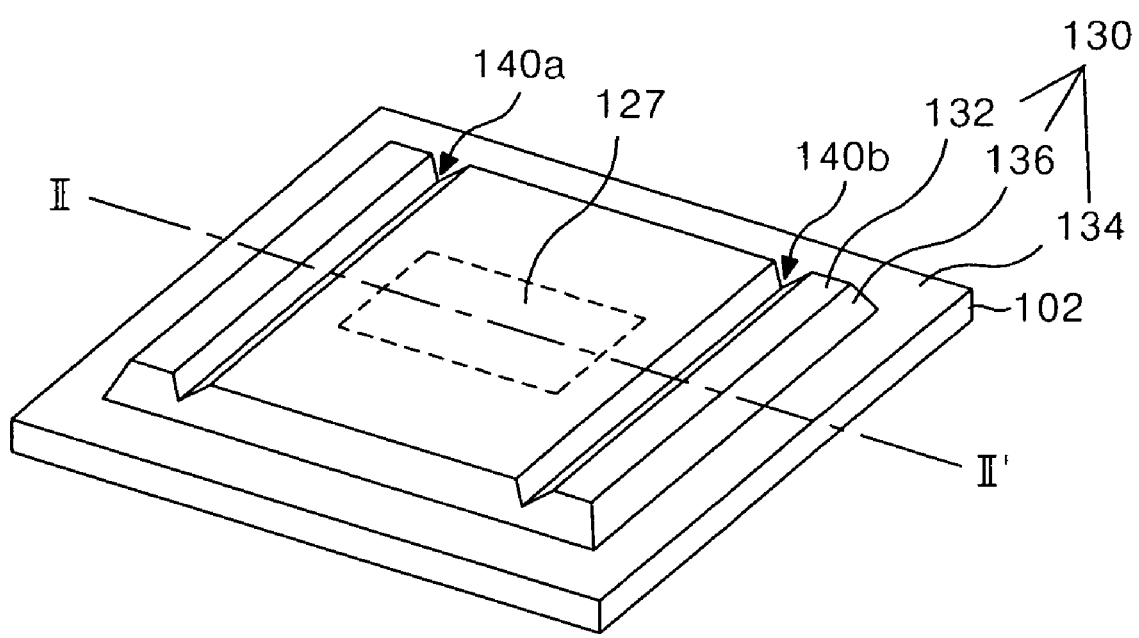
FIG. 3 is a perspective view showing a structure of an electro-luminescence display device according to an embodiment of the present invention.
Figure 4:
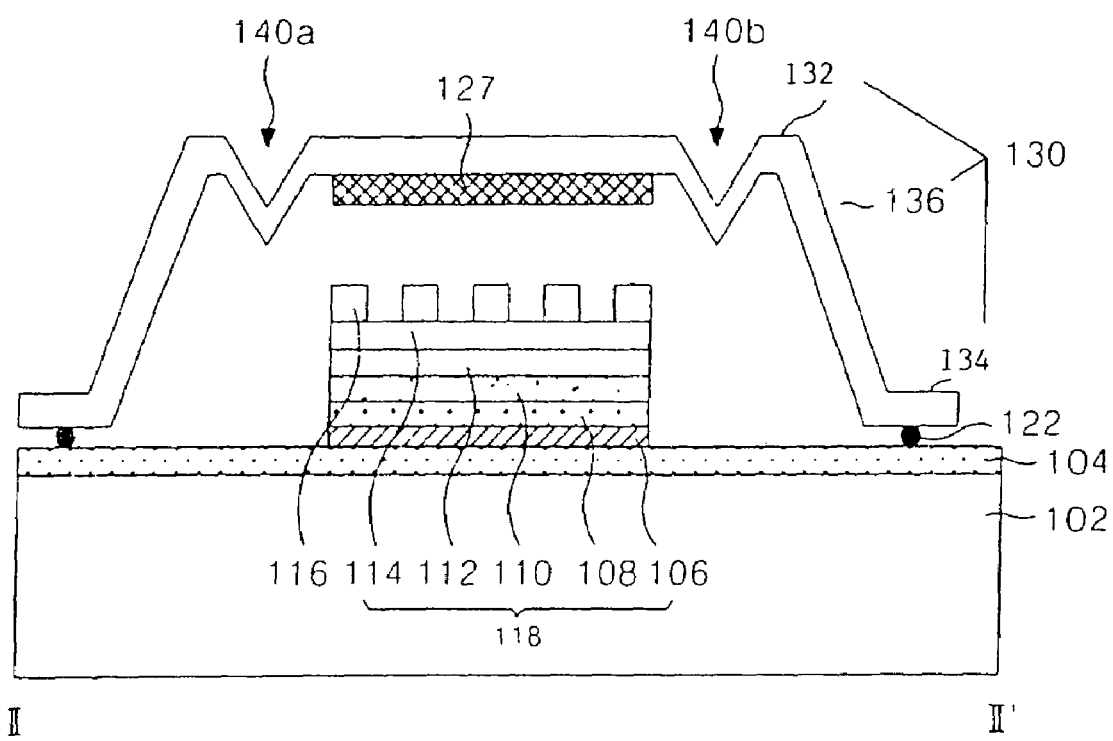
FIG. 4 is a section view of the electro-luminescence taken along the II-II' in FIG. 3.

FIG. 3 is a perspective view showing a structure of an electro-luminescence (EL) display device according to an embodiment of the present invention, and FIG. 4 is a section view of the electro-luminescence taken along the II-II' in FIG. 3.

Referring to FIG. 3 and FIG. 4, the EL display device according to the embodiment of the present invention includes an anode electrode 104 provided on a substrate 102, an organic compound layer 118 provided on the anode electrode 104, a cathode electrode 116 provided on the organic compound layer 118, and a packaging plate 134 for protecting the organic compound layer 118 from oxygen and moisture.

The anode electrode 104 is formed from any one of indium-tin-oxide (ITO), indium-zinc-oxide (IZO) and indium-tin-zinc-oxide (ITZO), etc. on the substrate 102 by a photolithography. Such an anode electrode 104 is used as a data electrode.

The organic compound layer 118 has a hole injection layer 106 and a hole carrier layer 108 sequentially formed on the anode electrode 104. A light-emitting layer 110 having a light emission function is provided on the hole carrier layer 108. Further, an electron carrier layer 112 and an electron injection layer 114 are sequentially formed on the light-emitting layer 110.

A cathode electrode 116 formed from aluminum (Al) having a high reflectivity is provided on the organic compound layer 118. Such a cathode electrode 116 is used as a scan electrode.

In the organic EL device, a driving voltage and current are applied to the anode electrode 104 and the cathode electrode 116, and then holes within the hole injection layer 106 and electrons within the electron injection layer 114 are progressed into the light-emitting layer 110 to thereby excite a phosphorous material within the light-emitting layer 110. A picture or an image is displayed by a principle in which a visible light generated from the light-emitting layer 110 in this manner is emitted out through the transparent anode electrode 104.

The packaging plate 130 is formed from glass, plastic or canister, etc so that the light-emitting layer 110 can be easily deteriorated by moisture and oxygen in the atmosphere. The packaging plate 130 includes a first face 132 provided with a getter 127 for absorbing moisture and oxygen and a strength reinforcing member 140 for reinforcing its strength, a second face 134 having a sealant 122 coated onto the edge thereof, and a connection face 136 for connecting the first face 132 with the second face 134 such that the first and second faces 132 and 134 have a desired height of step coverage. In this case, the packaging plate 130 is formed by a mold having the same shape. To this end, the packaging plate 130 is formed from a metal material.

The first face 132 is provided with the getter 27 made from barium oxide (BaO) or calcium oxide (CaO) so as to absorb moisture and oxygen. Herein, in order to prevent the getter 127 as a moisture absorbent from being dropped on the organic compound layer 118, a semi-transmitting film (not shown) is attached onto the first face 132 such that moisture and oxygen, etc. come in and out. The semi-transmitting film is formed from Teflon, polyester or paper, etc. The first face 132 is provided with first and second strength reinforcing members 140a and 140b taking a desired depth of long valley shape (e.g., having top and bottom surfaces intended toward the substrate) in one axis direction (e.g., the minor axis direction). In this case, the first and second reinforcing members 140a and 140b are provided between the end of the getter 127 formed at the first face 132 and the end of the first face 132 to be uninfluenced by the first and second strength reinforcing members 140a and 140b when the getter 127 is formed at the first face 132. Strength of the packaging plate 130 can be reinforced by the first and second strength reinforcing members 140a and 140a provided at the first face 132.

The second face 134 is joined with the sealant 122 coated onto the edge of the substrate 102, thereby attaching the package plate 130 onto the substrate 102. The second surface 134 of the packaging plate 130 is joined with the substrate 102 by the sealant 122 to make a vacuum state, thereby preventing a life of the EL device from being critically influenced by damage of the cathode electrode 16 and the organic compound layer 118 caused by moisture and oxygen in the atmosphere. Herein, the sealant 122 is made from an ultraviolet-curing epoxy, etc. This ultraviolet-curing epoxy allows the substrate 102 or the packaging plate 130 to be pressurized and joined by a technique such as a dispensing and a printing, etc. and then is cured by an irradiation of an ultraviolet ray. Subsequently, after a sealing was made by the sealant 122, the organic EL device is filled with an inactive gas with no moisture or oxygen. To this end, a glove box or a vacuum chamber is used.

The connection face 136 allows the first face 132 provided with the getter 127 and the second face 134 attached onto the substrate 102 to have a desired height of step coverage, thereby causing an internal space of the package plate 130 to be made into a vacuum state. In this case, the connection face 136 may vertically connect the first face 132 with the second face 134, or may connect the first face 132 with the second face 134 in such a manner to have a desired slope.

Figure 5:
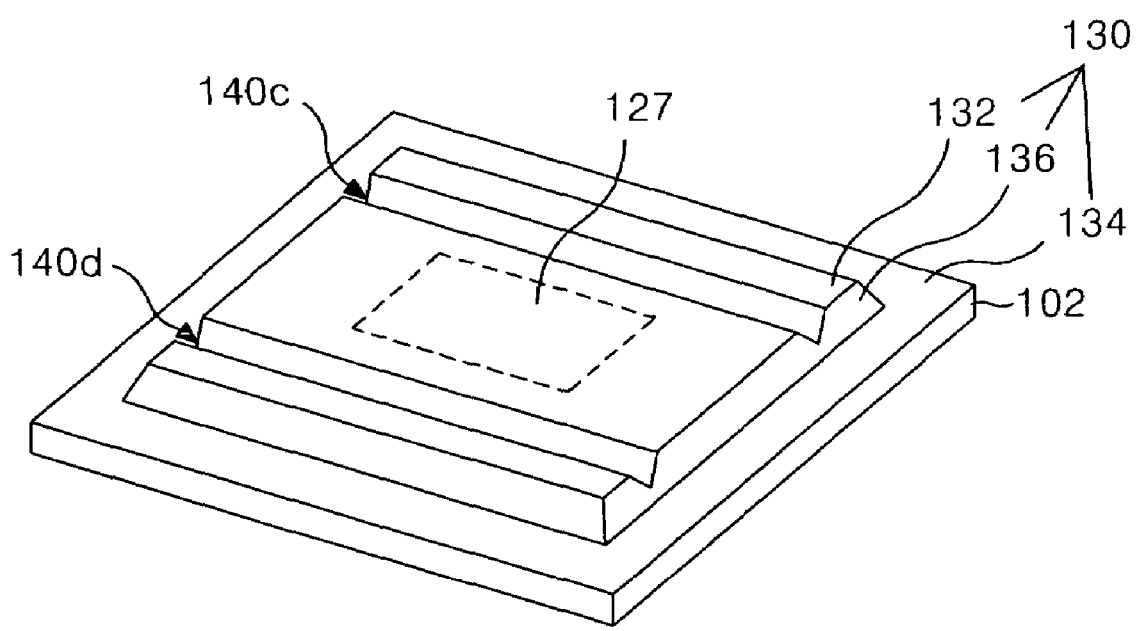
FIG. 5 to FIG. 8 illustrate an electro-luminescence display device according to another embodiment of the present invention.
Figure 6:
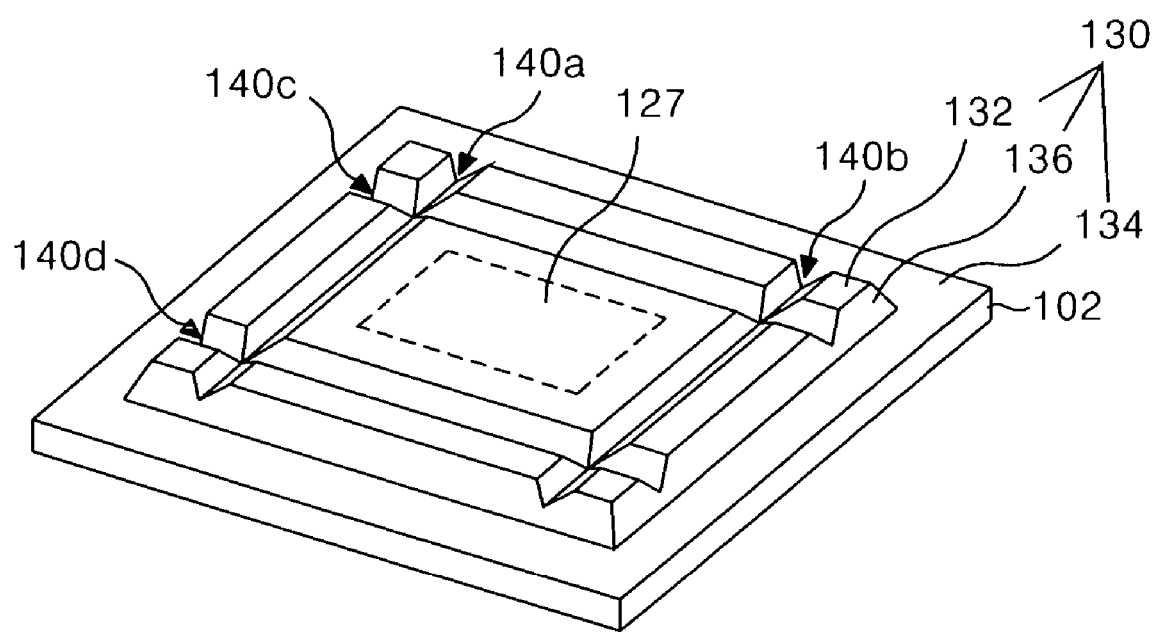
Figure 7:
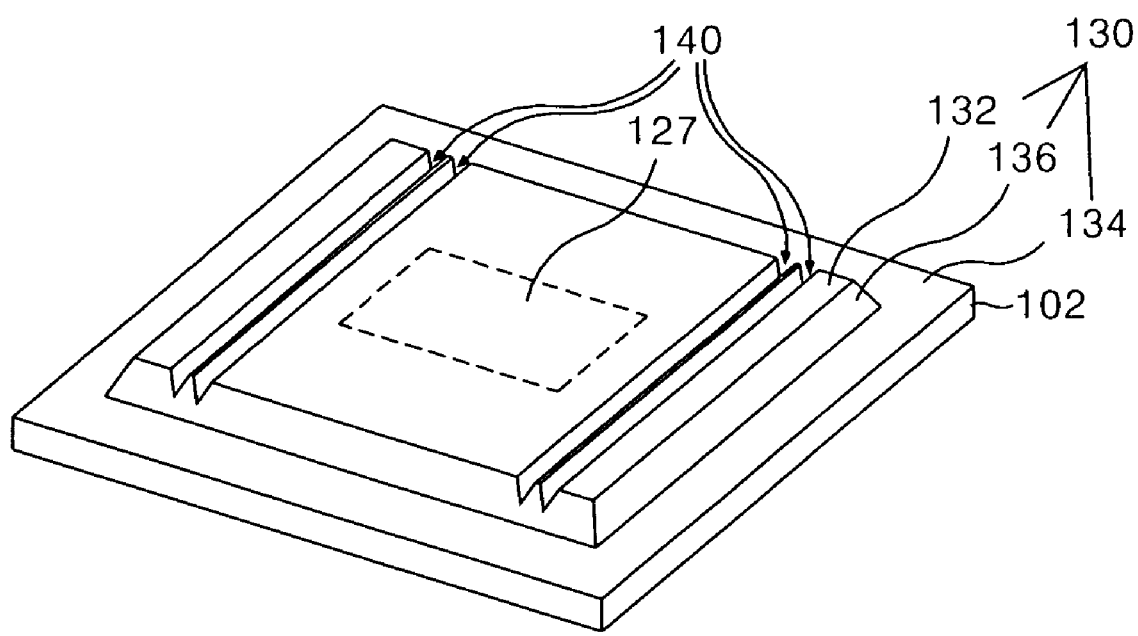
Figure 8:
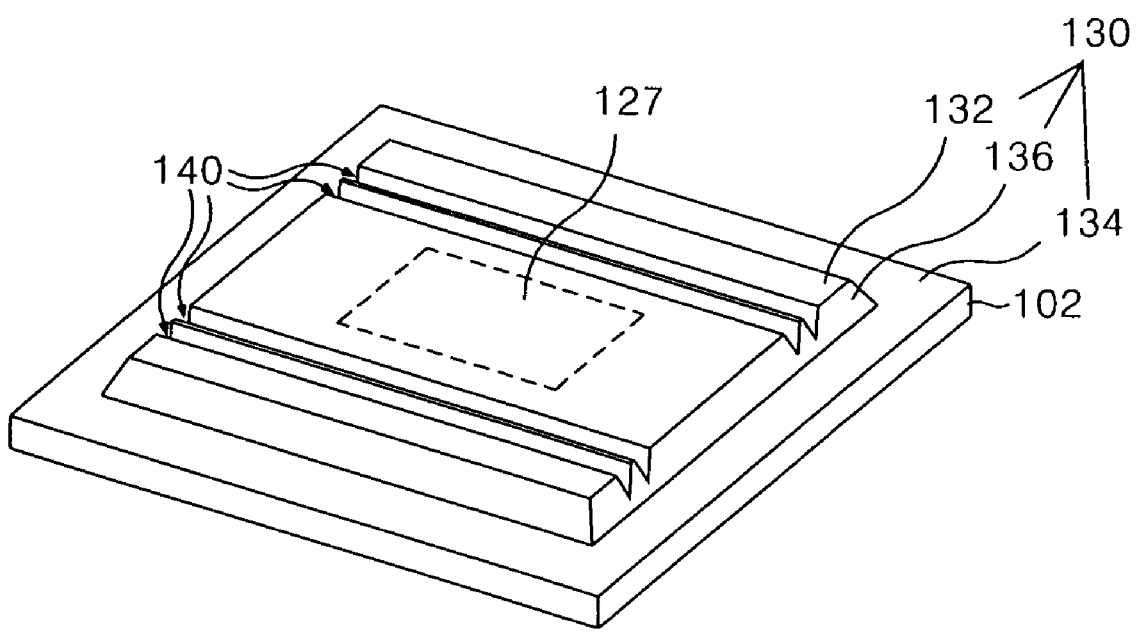

Alternatively, as shown in FIG. 5, the first face 132 of the packaging plate according to the embodiment of the present invention is provided with third and fourth strength reinforcing members 140c and 140d taking a long valley shape in one axis direction (e.g., a longitudinal axis direction). Otherwise, as shown in FIG. 6, the first face 132 of the packaging plate 130 is provided with first to fourth strength reinforcing members 140a to 140d taking a long valley shape) in two axes directions crossing each other (i.e., the minor axis direction and the longitudinal axis direction crossing each other). Strength of the packaging plate 130 can be reinforced by the first to fourth strength reinforcing members 140a to 140d provided at the first face 132. Otherwise, as shown in FIG. 7 and FIG. 8, the first face 132 of the packaging plate 130 according to the embodiment of the present invention is provided with at least two strength reinforcing members 140 taking a long valley shape, thereby reinforcing strength of the packaging plate 130.

As described above, the EL display device according to the present invention attaches the packaging plate onto the substrate so as to prevent the light-emitting layer from being easily deteriorated due to moisture and oxygen in the atmosphere. Furthermore, the packaging plate is provided with at least one of strength reinforcing member taking a long valley shape, thereby enhancing strength of the packaging plate.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. An electro-luminescence display device, comprising:
an organic compound layer provided on a substrate;
a packaging plate covering the organic compound layer and a portion of the substrate; and
a strength reinforcing member provided in the packaging plate,
wherein the strength reinforcing member comprises at least one recessed portion in only a peripheral location of the top surface of the packaging plate so that a bottom surface of only the peripheral location of the plate at the recessed portion is indented toward the substrate at a face of the packaging plate opposed to the substrate to reinforce a strength of the packaging plate, and
wherein the bottom surface of the strength reinforcing member is indented towards the substrate without extending beyond the organic compound layer.

2. The electro-luminescence display device according to claim 1, wherein the packaging plate includes:
a first face provided with a getter;
a second face attached onto the substrate; and
a connection face connected between the first face and the second face.

3. The electro-luminescence display device according to claim 2, wherein the strength reinforcing member is formed at the first face.

4. The electro-luminescence display device according to claim 3, wherein the strength reinforcing member is provided between the end of the getter and the end of the first face.

5. The electro-luminescence display device according to claim 4, wherein the strength reinforcing member is formed in one axis direction of the packaging plate.

6. The electro-luminescence display device according to claim 5, wherein said one axis direction is a minor axis direction of the packaging plate.

7. The electro-luminescence display device according to claim 5, wherein said one axis direction is a longitudinal axis direction of the packaging plate.

8. The electro-luminescence display device according to claim 4, wherein the strength reinforcing member is formed in two axes directions crossing each other.

9. The electro-luminescence display device according to claim 1, wherein the packaging plate is made from a metal.

10. The electro-luminescence display device according to claim 1, wherein lime packaging plate and the reinforcing member are made from a same material.

11. The electro-luminescence display device according to claim 1, wherein the at least one recessed portion is disposed along an entire length of the packaging plate.

12. The electro-luminescence display device according to claim 11, wherein the at least one recessed portion is disposed along the entire length of the packaging plate along a minor axis or major axis of the packaging plate.

13. An electro-luminescence display device, comprising:
an organic compound layer provided on a substrate;
a packaging plate covering the organic compound layer; and
a strength reinforcing member provided in the packaging plate,
wherein the strength reinforcing member comprises first to fourth recessed portions in only peripheral locations of a top surface of the packaging plate so that a bottom surface of only the peripheral locations of the plate at the recessed portions is indented toward the substrate, two of said recessed portions being disposed along an entire minor axis of the packaging plate and the other two recessed portions being disposed along an entire major axis of the packaging plate such that the recessed portions cross each other at corners of the packaging plate.

14. An electro-luminescence display device, comprising:
an organic compound layer provided on a substrate;
a packaging plate covering the organic compound layer;
a strength reinforcing member provided in the packaging plate; and
a getter provided on an inner surface of the packaging plate at a position above the organic compound layer,
wherein the strength reinforcing member comprises a recessed portion only in an outer peripheral location in a top surface of the packaging plate so that a bottom surface of the plate at the recessed portion is indented toward the substrate, and wherein two of the recessed portions are disposed on a top outer peripheral locations of the packaging plate opposite to one another outside of where the getter is disposed.

15. An electro-luminescence display device, comprising:
an organic compound layer provided on a substrate;
a packaging plate covering the organic compound layer; and
a strength reinforcing member provided in the packaging plate,
wherein the strength reinforcing member is located only at an outer peripheral portions of the packaging plate and comprises at least one V-shaped recessed portion in a top surface of the packaging plate so that a bottom surface of the plate at the recessed portion is indented toward the substrate at a face of the packaging plate opposed to the substrate.

* * * * *